United States Patent
Uemura et al.

(10) Patent No.: US 7,576,363 B2
(45) Date of Patent: Aug. 18, 2009

(54) GROUP III NITRIDE COMPOUND SEMICONDUCTOR LIGHT EMITTING DEVICE

(75) Inventors: Toshiya Uemura, Aichi (JP); Katsuhisa Sawazaki, Aichi (JP); Masahito Nakai, Aichi (JP); Yuhei Ikemoto, Aichi (JP)

(73) Assignee: Toyoda Gosei Co., Ltd., Nishikasugai-gun, Aichi (JP)

( * ) Notice: Subject to any disclaimer, the term of this patent is extended or adjusted under 35 U.S.C. 154(b) by 490 days.

(21) Appl. No.: 11/245,448

(22) Filed: Oct. 7, 2005

(65) Prior Publication Data

US 2006/0108603 A1    May 25, 2006

(30) Foreign Application Priority Data

Oct. 8, 2004    (JP)    ............................ P2004-296706

(51) Int. Cl.
    *H01L 33/00*    (2006.01)
(52) U.S. Cl. .................... 257/94; 257/101; 257/103; 257/79; 257/E33.01
(58) Field of Classification Search .................... 257/79, 257/101, 103, E33.01
    See application file for complete search history.

(56) References Cited

U.S. PATENT DOCUMENTS 7,193,246 B1 *   3/2007   Tanizawa et al. ............... 257/94

2003/0006418 A1 *   1/2003   Emerson et al. ............... 257/79

FOREIGN PATENT DOCUMENTS

| EP | 1453160 | * | 9/2004 |
|---|---|---|---|
| JP | 10-326943 | | 12/1998 |
| JP | 11-340509 | | 12/1999 |
| JP | 2002-198314 | | 7/2002 |
| JP | 2002-319743 | | 10/2002 |
| JP | 2003-17746 | | 1/2003 |

OTHER PUBLICATIONS

Reshchikov et al. Defect Reduction in Heavily Mg-Doped GaN, MRS Internet J. Nitride Semicond. Res. 4S1, G11.8 (1999).*

* cited by examiner

*Primary Examiner*—Davienne Monbleau
*Assistant Examiner*—Matthew Reames
(74) *Attorney, Agent, or Firm*—McGinn IP Law Group, PLLC (57) ABSTRACT

In a group III nitride compound semiconductor light emitting device comprising an n-type semiconductor layer, a p-type semiconductor layer having a superlattice structure in which a first layer comprising at least Al and a second layer having a different composition from that of the first layer are laminated repetitively, and an active layer interposed between the n-type semiconductor layer and the p-type semiconductor layer, wherein an Al composition of the first layer which is the closest to the active layer is set to be lower than that of each of the other first layers, and wherein a doping amount of a p-type impurity in the first layer which is the closest to the active layer is set to be smaller than that of the p-type impurity of each of the other first layers or non-doped.

21 Claims, 5 Drawing Sheets

AlGaN Mg FLOW – LIGHT OUTPUT

FIG. 4

AlGaN GROWTH TEMPERATURE – LIGHT OUTPUT

FIG. 5

FINAL BARRIER FILM THICKNESS – LIGHT OUTPUT

FIG. 6

GROUP III NITRIDE COMPOUND SEMICONDUCTOR LIGHT EMITTING DEVICE

This application is based on Japanese Patent Application No. 2004-296706, which is incorporated herein by reference.

BACKGROUND OF THE INVENTION

1. Field of the Invention

The present invention relates to a group III nitride compound semiconductor light emitting device.

2. Description of the Related Art

A group III nitride compound semiconductor light emitting device has such a structure that an active layer is interposed between an n-type semiconductor layer and a p-type semiconductor layer. In order to increase a light emission efficiency in the light emitting device, the active layer is set to have a multiple quantum well structure in some cases. Also in the n-type semiconductor layer and the p-type semiconductor layer, a superlattice structure is employed in some cases. By employing the superlattice structure in the n-type semiconductor layer and the p-type semiconductor layer, the resistance of each layer is reduced so that an electron injection efficiency and a hole injection efficiency to the active layer can be enhanced, respectively.

As documents related to the invention, see JP-A-10-326943, JP-A-11-340509, JP-A-2002-198314, JP-A-2002-319743 and JP-A-2003-17746.

The inventors have vigorously made investigations in order to enhance the light emission efficiency of the light emitting device. According to the investigations of the inventors, also in the case in which the p-type semiconductor layer has a superlattice structure in which an AlGaN layer and an InGaN layer are laminated repetitively, for example, the hole injection efficiency cannot be enhanced considerably. As a cause, it can be supposed that a p-type impurity such as Mg with which the p-type semiconductor layer is doped is diffused into the active layer. When the p-type impurity is diffused into the active layer, the quality of the crystal of the active layer is deteriorated, causing a reduction in the light emission efficiency.

Moreover, the active layer generally has a compound semiconductor composition which does not contain Al such as a GaN layer or an InGaN layer. On the other hand, a layer containing Al is used in the p-type semiconductor layer containing the superlattice structure. For this reason, there is a possibility that lattice mismatching might be caused with a change in the composition.

SUMMARY OF THE INVENTION

In order to solve the problems found newly at this time, the invention has been made by the inventors.

More specifically, in a group III nitride compound semiconductor light emitting device comprising an n-type semiconductor layer, a p-type semiconductor layer having a superlattice structure in which a first layer comprising at least Al and a second layer having a different composition from that of the first layer are laminated repetitively, and an active layer interposed between the n-type semiconductor layer and the p-type semiconductor layer, wherein an Al composition of the first layer which is the closest to the active layer is set to be lower than that of each of the other first layers, and wherein a doping amount of a p-type impurity in the first layer which is the closest to the active layer is set to be smaller than that of the p-type impurity of each of the other first layers or non-doped.

According to the group III nitride compound semiconductor light emitting device having such a structure, the Al composition of the first layer which is the closest to the active layer is reduced. Therefore, a difference in the composition from the active layer is reduced. Accordingly, the lattice mismatching between the first layer and the active layer is reduced so that the crystallinity of the first layer can be enhanced. Therefore, the crystallinity of another layer having a superlattice structure formed thereon can also be improved. Consequently, it is possible to enhance a hole injection efficiency from the p-type semiconductor layer into the active layer.

Moreover, the doping amount of the p-type impurity in the first layer which is the closest to the active layer is reduced or the non-doping is carried out. Therefore, it is possible to suppress the diffusion of the p-type impurity from the first layer into the active layer. Consequently, it is possible to prevent a deterioration in the quality of the crystal of the active layer and a reduction in the light emission efficiency.

According to another aspect of the invention, the growth temperature of the first layer which is the closest to the active layer is set to be higher than that of each of the other first layers.

The suitable growth temperature of the group III nitride compound semiconductor layer containing Al is generally higher than the growth temperature of an active layer containing no Al. In order to grow the first layer containing Al with a high crystallinity, accordingly, a comparatively high growth temperature is required. When all of the first layers (containing Al) constituting the superlattice structure are formed at a high growth temperature, however, the temperature influences the active layer. In the case in which the active layer is set to have a multiple quantum well structure, particularly, there is a possibility that the quality of the crystal of the well layer containing In might be generally damaged.

As in a second aspect of the invention, therefore, only the growth temperature of the first layer which is the closest to the active layer is set to be a comparatively high temperature and the same first layer is set to have high quality. The crystallinity of the first layer which is the closest to the active layer to be a base has high quality. Even if the growth temperatures of the first layers formed thereafter are set to be comparatively low, therefore, it is possible to maintain a sufficient crystallinity for them. When the p-type semiconductor layer having the superlattice structure is to be formed, a total temperature history related to the active layer is reduced. Consequently, it is possible to prevent the quality of the crystal of the active layer from being damaged.

According to a further aspect of the invention, the active layer has a multiple quantum well structure and a thickness of a barrier layer which is the closest to the p-type semiconductor layer in the multiple quantum well structure is set to be smaller than that of each of the other barrier layers.

Consequently, a hole injection efficiency from the p-type semiconductor layer to the active layer can be enhanced. Accordingly, the light emission efficiency of the light emitting device can be improved.

When a barrier layer which is the closest to the p-type semiconductor layer is set to be a thin film, generally, the p-type impurity of the p-type semiconductor layer is easily diffused into the active layer, which is not preferable. According to the invention, however, the doping amount of the p-type impurity in the first layer which is the closest to the active layer in the superlattice structure of the p-type semiconductor layer is reduced or the same first layer is subjected to non-doping. Therefore, it is possible to suppress the diffusion of the p-type impurity from the p-type semiconductor layer to the active layer. Even if the barrier layer which is the closest to the p-type semiconductor layer in the active layer is set to be a thin film, accordingly, the p-type impurity is diffused into the active layer so that the quality of the crystal can be prevented from being damaged.

DETAILED DESCRIPTION OF THE PREFERRED EMBODIMENTS

Each element constituting the invention will be described below in detail.

(p-Type Semiconductor Layer)

A p-type semiconductor layer has a superlattice structure in which a first layer containing Al and a second layer having a different composition from that of the first layer are laminated repetitively.

By employing the superlattice structure, the resistance of the p-type semiconductor layer is reduced, and furthermore, a crystallinity is also enhanced. Consequently, it is possible to contribute to an increase in the light emission efficiency of a light emitting device.

In order to have the superlattice structure, it is preferable that the thicknesses of the first layer and the second layer should be 1 to 6 nm. The thicknesses of the first layer and the second layer may be equal to each other or maybe different from each other. Moreover, it is preferable that the number of repetitions of the first layer and the second layer should be set to be four to eight.

The first layer contains at least Al as a group III element. The second layer is expressed in a general formula of $Al_xIn_yGa_{1-x-y}N$ ($0 \leq x \leq 1$, $0 \leq y \leq 1$, $0 \leq x+y \leq 1$). Boron (B) or thallium (Tl) may be substituted for a part of the group III element. Moreover, phosphorus (P), arsenic (As), antimony (Sb) or bismuth (Bi) can also be substituted for a part of nitrogen (N).

It is assumed that the second layer has a different composition from the first layer. The band gap energies of the first layer and the second layer may be equal to each other or may be different from each other.

In the superlattice structure of the p-type semiconductor layer, the Al composition of the first layer which is the closest to an active layer (which is preferably provided in contact with the active layer) is set to be lower than that of each of the other first layers. It is preferable that the former Al composition should be 10 to 80% of the latter Al composition. It is more preferable that the former Al composition should be 30 to 60%.

Moreover, the uppermost layer of the active layer is formed of GaN. When the first layer (which is the closest to the active layer) is provided in contact with the GaN layer, it is preferable that the Al composition of the first layer should be 5 to 25%. Consequently, lattice mismatching between the active layer and the first layer which is the closest to the active layer is eliminated substantially so that the first layer can be formed with a high crystallinity.

From a viewpoint of the prevention of the diffusion of a p-type impurity into the active layer, it is preferable that the doping amount of the p-type impurity in the first layer which is the closest to the active layer should be zero, that is, non-doping should be carried out. Even if the first layer is formed in the non-doping, there is a possibility that the p-type impurity should be diffused from other p-type semiconductor layers which are provided in contact therewith. As a result, the first layer which is the closest to the active layer is brought into a doping state in some cases. Also in these cases, the p-type impurity doping concentration of the first layer which is the closest to the active layer is lower than that of each of the other first layers. As a matter of course, the doping concentration of the p-type impurity in the first layer which is the closest to the active layer may be intentionally set to be lower than that of each of the other first layers.

For the p-type impurity, it is possible to use Mg, Zn, Be, Ca, Sr or Ba. It is also possible to heat the group III nitride compound semiconductor by an electron beam irradiation, a plasma irradiation or a furnace after the doping of the p-type impurity.

The growth temperature of the first layer which is the closest to the active layer is set to be higher than that of each of the other first layers. As a result of the growth of the first layer with a high crystallinity, consequently, the quality of a crystal is sufficient even if the other first layers are subsequently formed at a comparatively low temperature. By forming the other first layers at the comparatively low temperature, moreover, a thermal damage on the active layer is reduced.

In the example, AlGaN is employed for the first layer and InGaN is employed for the second layer. While a method of forming the group III nitride compound semiconductor layer is not particularly restricted, it is also possible to form the same semiconductor layer by a molecular beam epitaxy method (MBE method), a halide vapor phase epitaxy method (HVPE method), a sputtering method, an ion plating method or an electron shower method which is well known in addition to a metalorganic chemical vapor deposition method (MOCVD method).

(Active Layer)

Although the structure of the active layer is not particularly restricted, it is preferable to employ a multiple quantum well structure from a viewpoint of a light emission efficiency. As a matter of course, the active layer is not restricted to the multiple quantum well structure but it is possible to use a single hetero type, a double hetero type and a homojunction type. Moreover, it is also possible to employ a single quantum well structure.

The active layer can be formed by the group III nitride compound semiconductor layer. The group III nitride compound semiconductor is expressed in a general formula of $Al_xGa_yIn_{1-x-y}N$ ($0 \leq X \leq 1$, $0 \leq Y \leq 1$, $0 \leq X+Y \leq 1$), and contains a so-called binary type of AlN, GaN and InN and a so-called ternary type of $Al_xGa_{1-x}N$, $Al_xIn_{1-x}N$ and $Ga_xIn_{1-x}N$ ($0<x<1$). Boron (B) or thallium (Tl) may be substituted for a part of a group III element, and furthermore, phosphorus (P), arsenic (As), antimony (Sb) or bismuth (Bi) may be substituted for a part of nitrogen (N). While the method of forming the group III nitride compound semiconductor layer is not particularly restricted, it is also possible to form the same semiconductor layer by the molecular beam epitaxy method (MBE method), the halide vapor phase epitaxy method (HVPE method), the sputtering method, the ion plating method or the electron shower method which is well known in addition to the metalorganic chemical vapor deposition method (MOCVD method).

In the case in which the active layer is set to have the multiple quantum well structure, it is preferable that a well layer should be formed of InGaN and a barrier layer should be formed of GaN. More specifically, the active layer does not contain Al. As a result, an Al composition in the first layer (the first layer) containing Al is reduced in the p-type superlattice structure formed on the active layer. Consequently, a semiconductor composition is approximated as greatly as possible and the lattice mismatching between the semiconductor layers can be reduced as much as possible.

In the active layer having the multiple quantum well structure, the barrier layer which is the closest to the p-type semiconductor layer is set to be a thinner film than the other barrier layers. It is preferable that the former thickness should be set to be 10 to 80% of the latter thickness. It is further preferable that the same thickness should be 20 to 60%. In order to cause the barrier layer to fulfill the function, it is necessary to have a thickness of approximately 3 nm.

Consequently, a hole injection efficiency from the p-type semiconductor layer can be enhanced. The barrier layer can be thus a thin film because the doping amount of the p-type impurity of the first layer which is the closest to the active layer (preferably, which is provided in contact with the active layer) is reduced or set to be zero so that the diffusion of the p-type impurity from the p-type semiconductor layer into the active layer is eliminated.

(n-Type Semiconductor Layer)

While it is also preferable that an n-type semiconductor layer should have the superlattice structure, it may be formed by a single semiconductor layer or a plurality of semiconductor layers.

In the case in which the n-type semiconductor layer has the superlattice structure, it is preferable that the thicknesses of a first layer and a second layer should be set to be 1 to 6 nm. The thicknesses of the first layer and the second layer may be equal to each other or may be different from each other. Moreover, it is preferable that the number of repetitions of the first layer and the second layer should be 6 to 30.

The first layer and the second layer are expressed in a general formula of $Al_xIn_yGa_{1-x-y}N$ ($0 \leq x \leq 1$, $0 \leq y \leq 1$, $0 \leq x+y \leq 1$). B or Tl may be substituted for a part of a group III element, and furthermore, P, As, Sb or Bi may be substituted for a part of N.

It is assumed that the second layer has a different composition from the first layer. The band gap energies of the first layer and the second layer may be equal to each other or may be different from each other.

It is possible to use Si, Ge, Se, Te and C for the n-type impurity.

While the method of forming the group III nitride compound semiconductor layer is not particularly restricted, it is also possible to form the same semiconductor layer by the molecular beam epitaxy method (MBE method), the halide vapor phase epitaxy method (HVPE method), the sputtering method, the ion plating method or the electron shower method which is well known in addition to the metalorganic chemical vapor deposition method (MOCVD method).

(Example)

An example of the invention will be described below.

Figure 1:
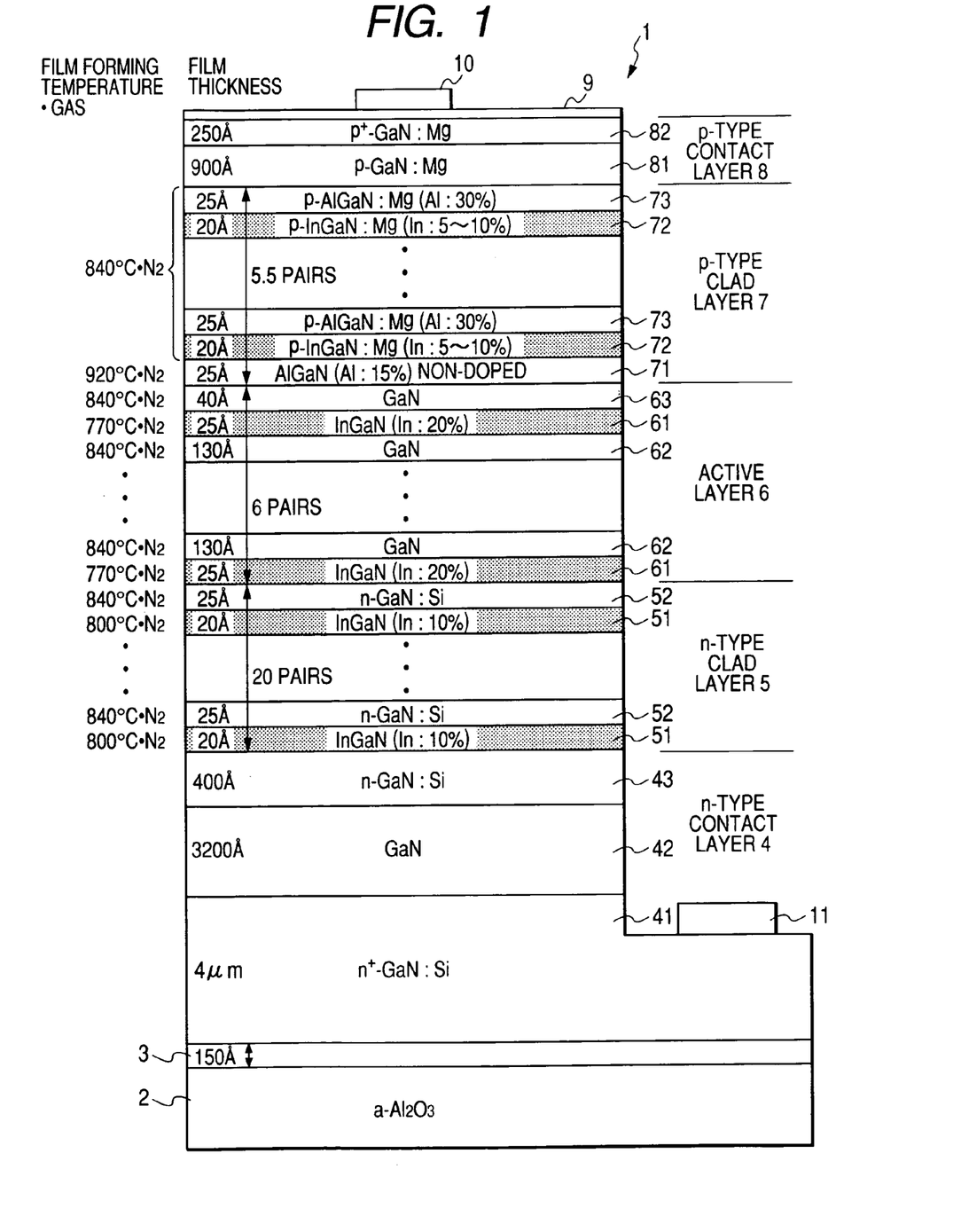
FIG. 1 is a typical view showing a structure of a light emitting device according to an example of the invention.

The example relates to a light emitting diode 1 and a structure thereof is shown in FIG. 1.

Sapphire is employed for a substrate 2 and a group III nitride compound semiconductor layer is laminated on an "a" surface thereof. It is possible to use, as a substrate material, a hexagonal material such as SiC (silicon carbide) and GaN (gallium nitride) and a cubic material such as Si (silicon), GaP (gallium phosphide) and GaAs (gallium arsenide) in addition to the sapphire.

An AlN buffer layer 3 is formed on the sapphire substrate 2 by sputtering. The buffer layer 3 can also be formed by another method such as an MOCVD method. Moreover, it is also possible to form a buffer layer by another group III nitride compound semiconductor material such as GaN in addition to AlN.

The group III nitride compound semiconductor layer shown in FIG. 1 is formed on the buffer layer 3 by a related method (MOCVD method). In the growth method, an ammonium gas and an alkyl compound gas of a group III element, for example, trimethyl gallium (TMG), trimethyl aluminum (TMA) and trimethyl indium (TMI) are supplied onto the substrate heated to a proper temperature and a thermolytic reaction is caused to grow a desirable crystal on the substrate.

An n-type semiconductor layer is constituted by an n-type contact layer 4 and an n-type clad layer 5.

The n-type contact layer 4 has a GaN layer 42 and an n-GaN layer 43 laminated sequentially on an $n^+$-GaN layer 41 to be a thick film.

The n-type clad layer 5 has such a structure that an InGaN layer 51 and an n-GaN layer 52 are laminated repetitively.

An active layer 6 has such a structure that a well layer 61 formed of InGaN and a barrier layer 62 formed of GaN are laminated repetitively. In the active layer 6, a barrier layer 63 provided in contact with a p-type semiconductor layer. (a thickness of 4 nm) is formed to be a thinner film than the other barrier layer 61 (13 nm). Consequently, a hole injection efficiency from the p-type layer can be enhanced and a light emission efficiency in the active layer can be improved.

The p-type semiconductor layer is constituted by a p-type clad layer 7 and a p-type contact layer 8.

In the p-type clad layer 7, a layer provided in contact with the active layer 6 is set to be a non-doped AlGaN layer 71, and a p-InGaN layer 72 and a p-AlGaN layer 73 are laminated repetitively thereon. The AlGaN layers 71 and 73 correspond to the first layers according to the invention and the non-doped AlGaN layer 71 corresponds to the first layer which is the closest to the active layer. The p-InGaN layer 72 corresponds to the second layer. The AlGaN layer 71 provided in contact with the active layer 6 is set to be non-doped so that a p-type impurity (Mg) contained in the p-type semiconductor layer can be prevented from being diffused into the active layer 6. Accordingly, the quality of the crystal of the active layer 6 can be stabilized.

In the p-type clad layer 7, the Al composition (15%) of the non-doped AlGaN layer 71 is smaller than the Al composition (30%) of the other AlGaN layer 73. The uppermost layer of the active layer 6 is the GaN layer 63. By reducing the Al composition of the AlGaN layer 71 provided in contact therewith, the lattice mismatching of the GaN layer 63 and the AlGaN layer 71 can be relieved. Accordingly, the crystallinity of the AlGaN layer 71 can be enhanced. As a result, the crystallinity of a semiconductor layer formed thereon can also be enhanced.

In the p-type clad layer 7, moreover, the growth temperature of the non-doped AlGaN layer 71 is set to be 920° C. and is set to be higher than the growth temperature (840° C.) of the other AlGaN layer 73. A high crystallinity can be maintained in the non-doped AlGaN layer 71 which is grown at a comparatively high temperature. In other words, the crystallinity of a layer to be the base of the p-type clad layer 7 can be enhanced. As a result, even if the growth temperature of the AlGaN layer 73 formed thereon is reduced, a sufficient crystallinity can be obtained as the whole p-type clad layer 7.

The p-type contact layer 8 is laminated on the p-type clad layer 7. The p-type contact layer 8 according to the example has a two-layer structure having a p-GaN layer 81 and a $p^{30}$-GaN layer 82. The reference numeral 9 denotes a light transmission electrode and is formed by a transparent conductive metal containing gold. The light transmission electrode 9 is laminated by covering almost the whole surface of the p-type contact layer 8. A p-type electrode 10 is also constituted by a material containing gold and is formed on the light transmission electrode 9 by evaporation.

An n electrode 11 is formed, through evaporation, on the surface of the $n^+$-GaN layer 41 exposed by etching.

Figure 2:
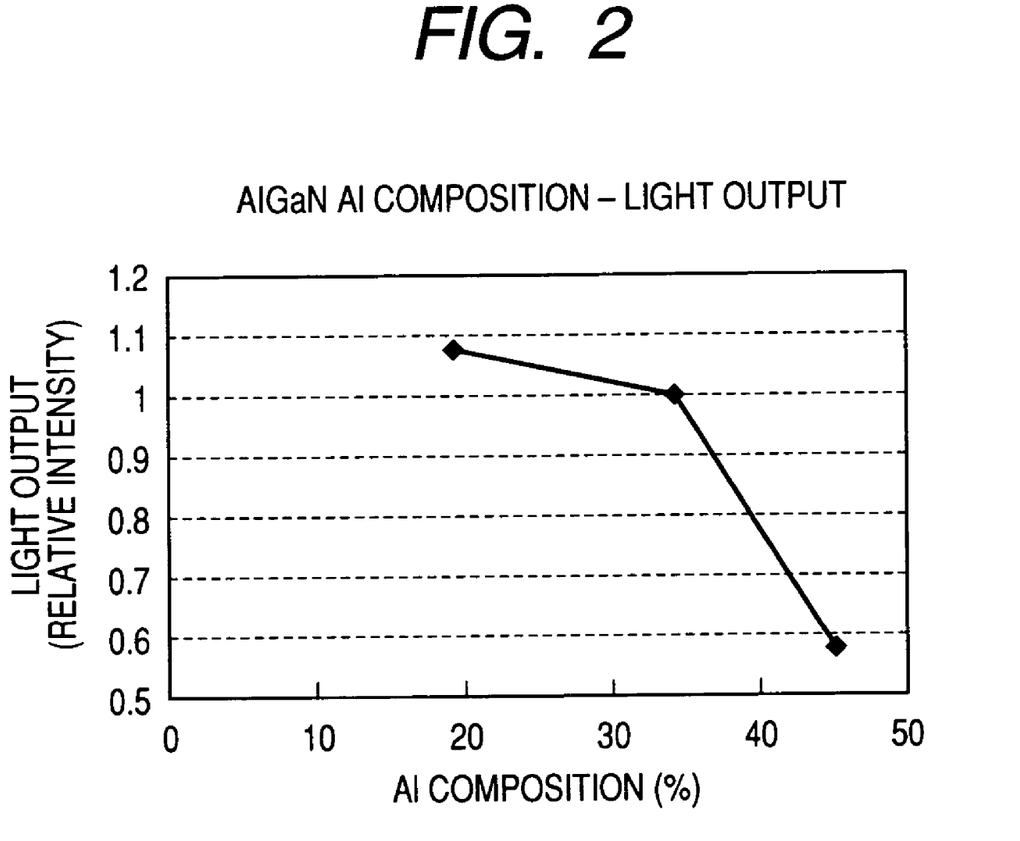
FIG. 2 is a graph showing a relationship between an Al composition of an AlGaN layer provided in contact with an active layer in a p-type clad layer having a superlattice structure and a light output of the light emitting device in the change of the Al composition.

FIG. 2 shows a light output of the light emitting device 1 which is obtained when the Al composition of the non-doped AlGaN layer 71 which is the closest to the active layer 6 is changed in the p-type clad layer 7 of the light emitting device 1 illustrated in FIG. 1.

As is apparent from the result of FIG. 2, the light output, that is, the light emission efficiency is enhanced when the Al composition of the AlGaN layer 71 is reduced.

Figure 3:
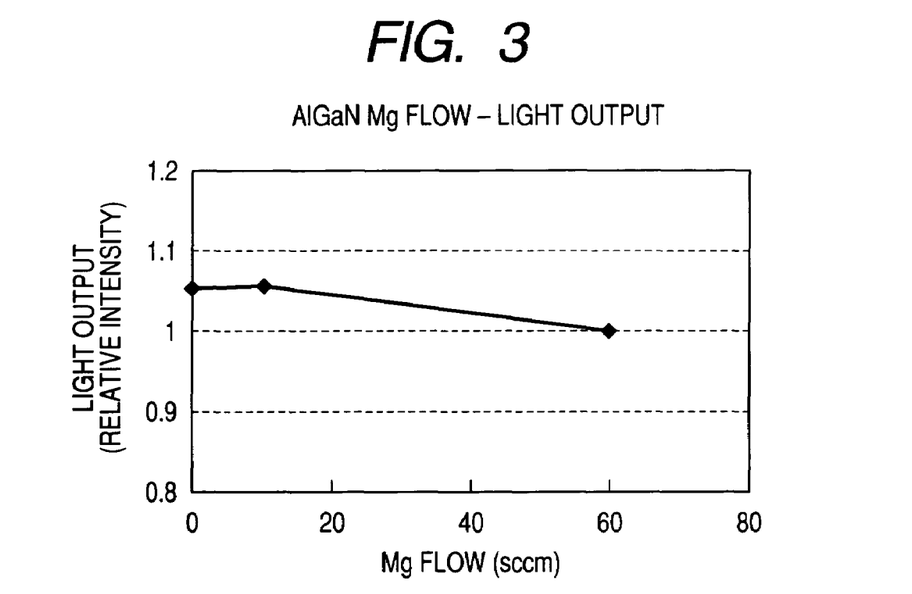
FIG. 3 is a graph showing a relationship between a doping amount of a p-type impurity into the AlGaN layer which is provided in contact with the active layer in the p-type clad layer having the superlattice structure and the light output of the light emitting device in the change of the doping amount.

FIG. 3 shows a relationship between a doping amount of the p-type impurity (Mg) into the AlGaN layer 71 which is the closest to the active layer 6 in the p-type clad layer 7 of the light emitting device 1 illustrated in FIG. 1 and the light output of the light emitting device 1 in the change of the doping amount.

As is apparent from the result of FIG. 3, when the doping amount of the p-type impurity is reduced in the AlGaN layer 71, the light output, that is, the light emission efficiency is enhanced.

Figure 4:
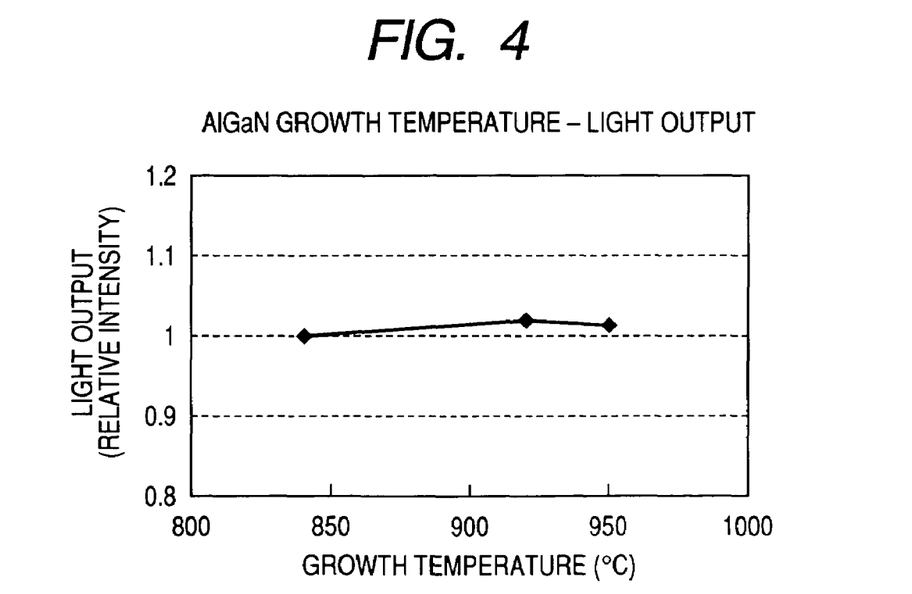
FIG. 4 is a graph showing a relationship between a growth temperature of the AlGaN layer provided in contact with the active layer in the p-type clad layer having the superlattice structure and the light output of the light emitting device in the change of the growth temperature.

FIG. 4 shows a relationship between a growth temperature of the AlGaN layer 71 which is the closest to the active layer 6 in the p-type clad layer 7 of the light emitting device 1 illustrated in FIG. 1 and the light output of the light emitting device 1 in the change of the growth temperature.

As is apparent from the result of FIG. 4, when the growth temperature of the AlGaN layer 71 is raised, the light output, that is, the light emission efficiency is enhanced.

Figure 5:
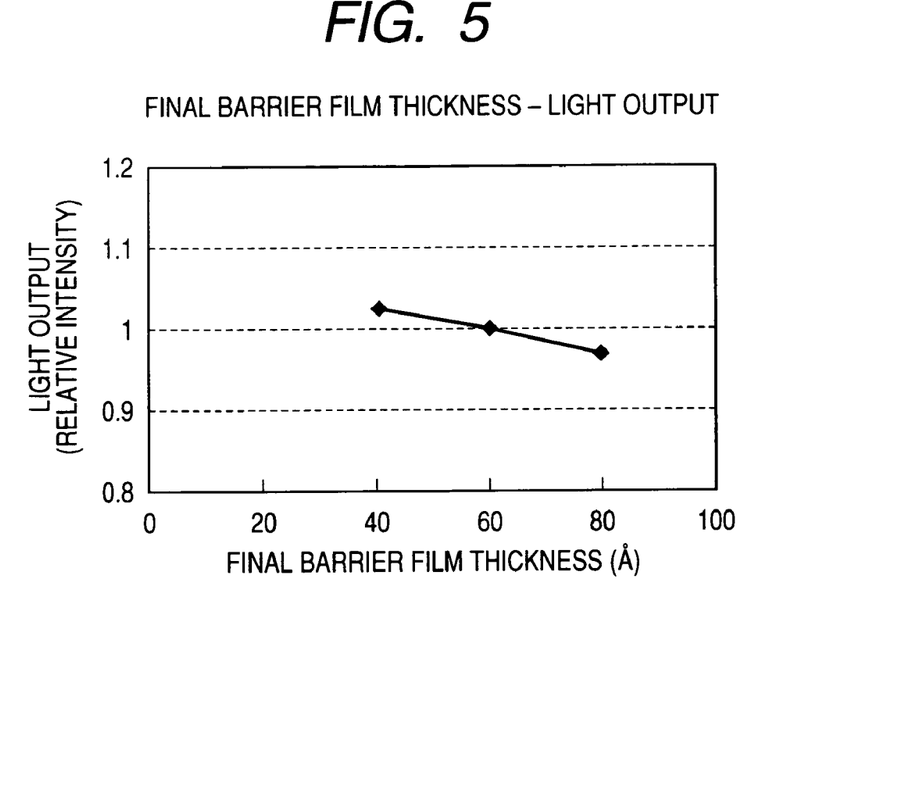
FIG. 5 is a graph showing a relationship between a thickness of a final barrier layer provided in contact with the p-type clad layer in an active layer having a multiple quantum well structure and the light output of the light emitting device in the change of the thickness.

FIG. 5 shows a relationship between a thickness of the final barrier layer 63 in the active layer 6 in the light emitting device 1 illustrated in FIG. 1 and the light output of the light emitting device 1 in the change of the thickness.

As is apparent from the result of FIG. 5, when the thickness of the AlGaN layer 71 is reduced, the light output, that is, the light emission efficiency is enhanced.

Figure 6:
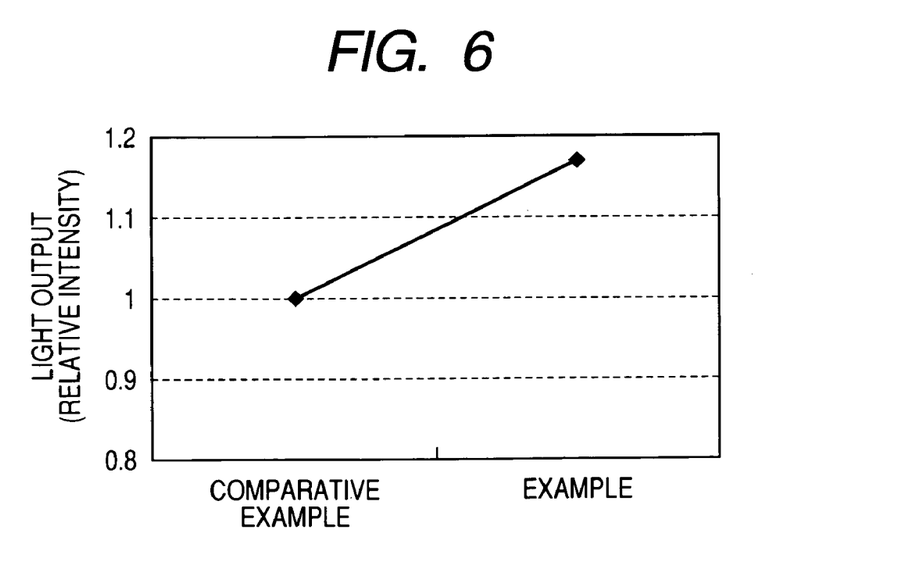
FIG. 6 is a graph showing a comparison between the light outputs of the light emitting device according to the example and a light emitting device according to a comparative example.
Figure 7:
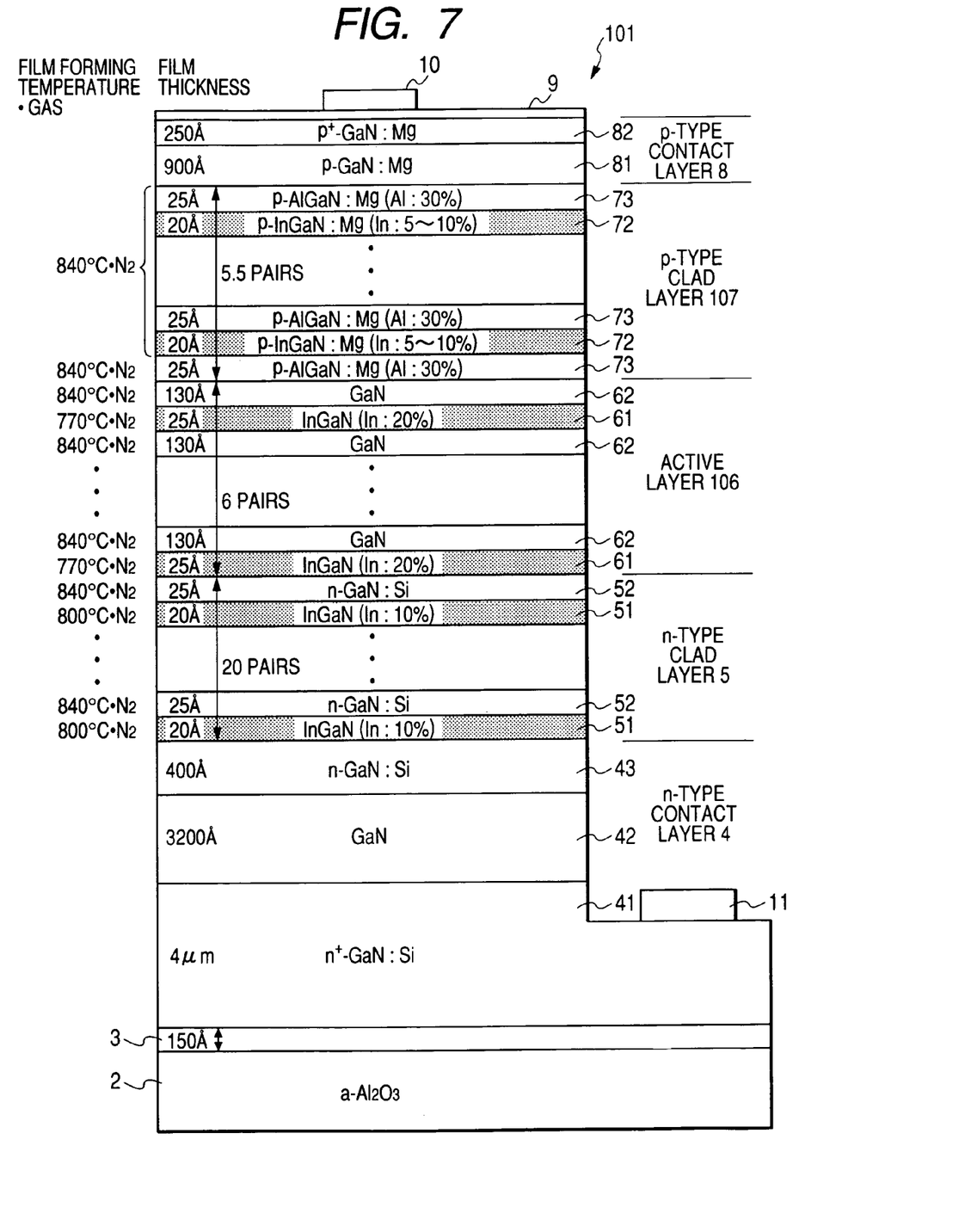
FIG. 7 is a typical view showing a structure of the light emitting device according to the comparative example.

FIG. 6 shows a comparison between light outputs according to the example in FIG. 1 and a comparative example (see FIG. 7). In FIG. 7, the same elements as those in FIG. 1 have the same reference numerals and description thereof will be omitted.

More specifically, in a light emitting device 101 according to the comparative example shown in FIG. 7, a final barrier layer provided in contact with a p-type clad layer 107 in an active layer 106 is set to have a thickness of 13 nm and has the same structure as that of each of other barrier layers 62. Moreover, an AlGaN layer provided in contact with the active layer 106 in the p-type clad layer 107 also has the same structure and growth temperature as that in each of other AlGaN layers 73.

As is apparent from the result of FIG. 6, the light emitting device 1 according to the example of the invention can have an excellent light emission efficiency.

The invention is not restricted to the description of the embodiment and the example according to the invention. Various changed manners can also be included in the invention without departing from the claims within such a range as to be easily supposed by the skilled in the art.

What is claimed is;:

1. A group III nitride compound semiconductor light emitting device comprising:
   an n-type semiconductor layer;
   a p-type net conductivity semiconductor layer comprising a superlattice structure comprising a plurality of first and second layers, said first layers comprising at least Al and said second layers having a composition differing from a composition of the first layers, said plurality of first and second layers being laminated alternately and repetitively; and
   an active layer interposed between the n-type semiconductor layer and the p-type net conductivity semiconductor layer,
   wherein a layer of said first layers located closest to the active layer has an Al composition that is less than an Al composition of other layers of said first layers,
   wherein said layer of said first layers located closest to the active layer comprises one of:
      no doping; and
      a doping amount of a p-type impurity that is less than a doping amount of a p-type impurity of said other layers of said first layers, and
   wherein the first layers comprise AlGaN and the second layers comprise InGaN.

2. The group III nitride compound semiconductor light emitting device according to claim 1, wherein the active layer does not contain Al.

3. The group III nitride compound semiconductor light emitting device according to claim 1, wherein said layer of said first layers located closest to the active layer has a growth temperature that is greater than a growth temperature of said other layers of said first layers.

4. The group III nitride compound semiconductor light emitting device according to claim 1, wherein a thickness of the first layers and a thickness of the second layers is in a range from 1 nm to 6 nm.

5. The group III nitride compound semiconductor light emitting device according to claim 1, wherein a number of repetitions of the first layers and the second layers is in a range from four repetitions to eight repetitions.

6. The group III nitride compound semiconductor light emitting device according to claim 1, wherein said layer of the first layers located closest to the active layer is in contact with the active layer.

7. The group III nitride compound semiconductor light emitting device according to claim 1, wherein the Al composition of the layer of said first layers located closest to the active layer is in a range from 10% to 80% of said Al composition of the other layers of said first layers.

8. The group III nitride compound semiconductor light emitting device according to claim 7, wherein the Al composition of the layer of said first layers located closest to the active layer is in a range from 30% to 60% of the Al composition of the other layers of said first layers.

9. The group III nitride compound semiconductor light emitting device according to claim 1, wherein the Al composition of the layer of said first layers located closest to the active layer is in a range from 5% to 25% of said layer of said first layers located closest to the active layer.

10. The group III nitride compound semiconductor light emitting device according to claim 1, wherein the active layer has a multiple quantum well structure, and
   wherein a barrier layer located closest to the p-type net conductivity semiconductor layer in the multiple quantum well structure is in contact with said layer of said first layers.

11. The group III nitride compound semiconductor light emitting device according to claim 10, wherein a well layer in the multiple quantum well structure comprises InGaN and the barrier layer comprises GaN.

12. The group III nitride compound semiconductor light emitting device according to claim 10, wherein the thickness of the barrier layer located closest to the p-type net conductivity semiconductor layer is in a range from 10% to 80% of the thickness of the other barrier layers.

13. The group III nitride compound semiconductor light emitting device according to claim 12, wherein the thickness of the barrier layer located closest to the p-type net conductivity semiconductor layer is in a range from 20% to 60% of the thickness of the other barrier layers.

14. The group III nitride compound semiconductor light emitting device according to claim 10, wherein the thickness of the barrier layer is at least 3 nm.

15. The group III nitride compound semiconductor light emitting device according to claim 1, wherein the n-type semiconductor layer comprises a superlattice structure.

16. The group III nitride compound semiconductor light emitting device according to claim 1, wherein said p-type impurity comprises one of Mg, Zn, Be, Ca, Sr, and Ba.

17. The group III nitride compound semiconductor light emitting device according to claim 11, wherein the active layer is devoid of Al.

18. The group III nitride compound semiconductor light emitting device according to claim 1, wherein a number of repetitions of the first layers and the second layers is in a range from six repetitions to thirty repetitions.

19. The group III nitride compound semiconductor light emitting device according to claim 1, wherein said first layers and said second layers comprise a general formula $Al_xIn_yGa_{1-x-y}N$, where $0 \leq x \leq 1$, $0 \leq y \leq 1$, and $0 \leq x+y \leq 1$.

20. The group III nitride compound semiconductor light emitting device according to claim 1, wherein an uppermost layer of said active layer comprises GaN.

21. The group III nitride compound semiconductor light emitting device according to claim 1, further comprising a barrier layer located closest to the p-type net conductivity semiconductor layer in a multiple quantum well structure of said active layer, said barrier layer being located next to said layer of said first layers.

* * * * *